(12) United States Patent
Park et al.

(10) Patent No.: US 12,066,331 B2
(45) Date of Patent: Aug. 20, 2024

(54) POLARIZATION ANALYSIS APPARATUS AND METHOD FOR ADJUSTING ANGLE OF INCIDENCE OR NUMERICAL APERTURE USING APERTURE

(71) Applicant: AUROS TECHNOLOGY, INC., Hwaseong-si (KR)

(72) Inventors: Mi Ta Park, San Jose, CA (US); Jae Jun Lee, Hwaseong-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/227,723

(22) Filed: Jul. 28, 2023

(65) Prior Publication Data

US 2023/0375411 A1    Nov. 23, 2023

Related U.S. Application Data

(63) Continuation of application No. PCT/KR2022/012755, filed on Aug. 25, 2022.

(30) Foreign Application Priority Data

Apr. 19, 2022    (KR) .................. 10-2022-0048486

(51) Int. Cl.
*G01J 4/04*     (2006.01)
*G01N 21/21*    (2006.01)

(52) U.S. Cl.
CPC .............. *G01J 4/04* (2013.01); *G01N 21/21* (2013.01)

(58) Field of Classification Search
CPC .................................... G01J 4/04; G01N 21/21
See application file for complete search history.

(56) References Cited

U.S. PATENT DOCUMENTS

| 8,139,232 B2* | 3/2012 | Wolf .................... G01N 21/211 |
| | | 356/369 |
| 2009/0059228 A1* | 3/2009 | Horie ..................... G01J 3/447 |
| | | 356/369 |

(Continued)

FOREIGN PATENT DOCUMENTS

| JP | 2905448 B2 | 6/1999 |
| JP | H11-316163 A | 11/1999 |

(Continued)

OTHER PUBLICATIONS

Korean Office Action for related KR Application No. 10-2022-0048486 mailed Aug. 24, 2022 from Korean Intellectual Property Office.

(Continued)

*Primary Examiner* — Roy M Punnoose
(74) *Attorney, Agent, or Firm* — Paratus Law Group, PLLC

(57) ABSTRACT

There is provided a polarization analysis apparatus that adjusts an angle of incidence or a numerical aperture by using an aperture. The apparatus includes: a first aperture that transmits a lighting beam reflected from a sample on a substrate; a second aperture that transmits a lighting beam having passed through the first aperture; and a detector that detects a lighting beam having passed through the second aperture and selects an angle of incidence of the lighting beam and numerical apertures of the first aperture and the second aperture.

13 Claims, 8 Drawing Sheets

(56) References Cited

U.S. PATENT DOCUMENTS

| | | | | |
|---|---|---|---|---|
| 2009/0066953 A1* | 3/2009 | Horie | ............... | G01B 11/0641 |
| | | | | 356/369 |
| 2020/0025678 A1* | 1/2020 | Rapaport | ........... | G01B 11/0641 |
| 2020/0098486 A1* | 3/2020 | Coenen | ............... | G03F 7/70158 |
| 2020/0232903 A1* | 7/2020 | Borri | ...................... | G01N 21/31 |
| 2020/0363332 A1* | 11/2020 | Antonelli | ........... | G01N 21/4785 |

FOREIGN PATENT DOCUMENTS

| | | | |
|---|---|---|---|
| JP | 2008-139613 A | 6/2008 |
| JP | 2020-500289 A | 1/2020 |
| KR | 10-2008-0114331 A | 12/2008 |
| KR | 10-2015-0011313 A | 1/2015 |
| KR | 10-1800471 B1 | 11/2017 |
| KR | 10-2134943 B1 | 8/2020 |

OTHER PUBLICATIONS

Korean Office Action for related KR Application No. 10-2022-0048486 mailed Dec. 27, 2022 from Korean Intellectual Property Office.

Korean Notice of Allowance for related KR Application No. 10-2022-0048486 mailed Jan. 18, 2023 from Korean Intellectual Property Office.

* cited by examiner

FIG. 2
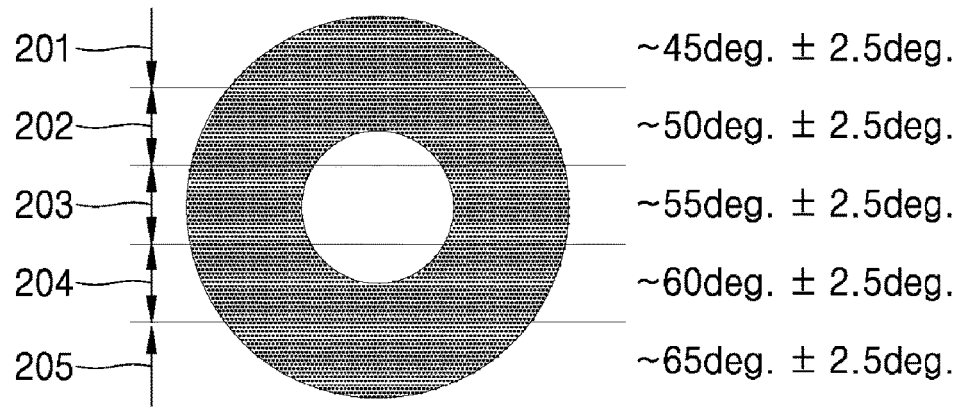
FIG. 3
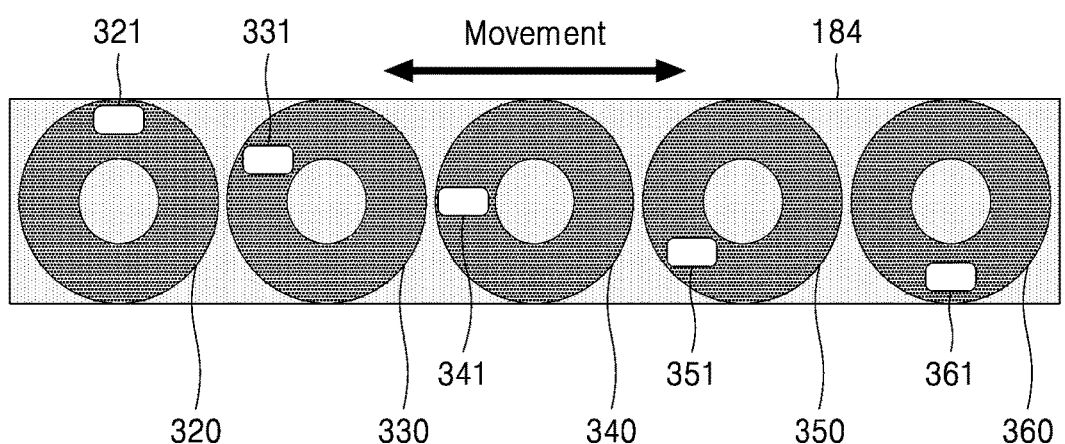
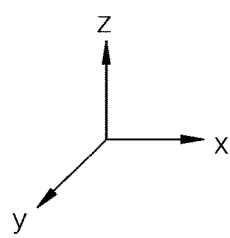

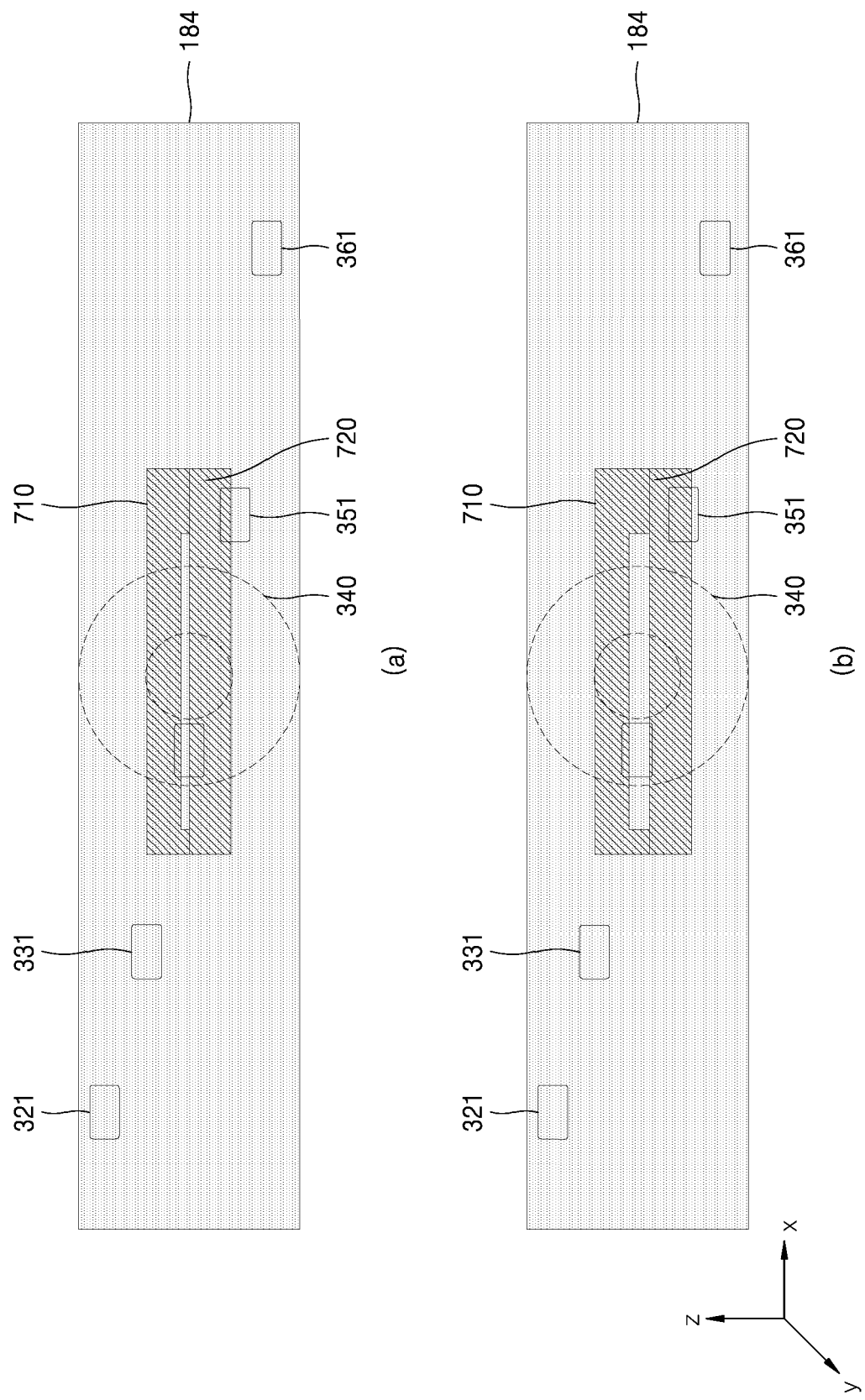

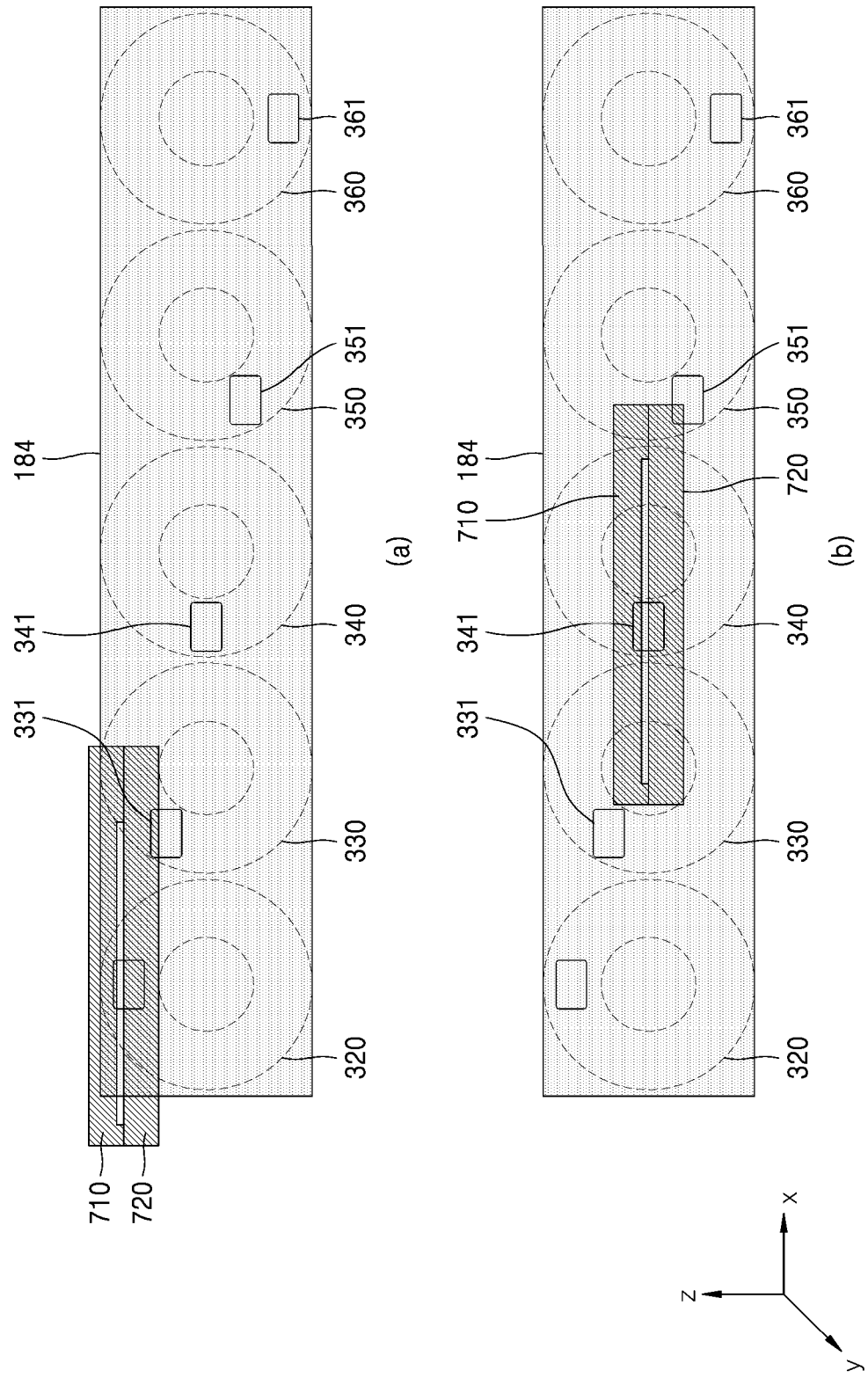

POLARIZATION ANALYSIS APPARATUS AND METHOD FOR ADJUSTING ANGLE OF INCIDENCE OR NUMERICAL APERTURE USING APERTURE

CROSS-REFERENCE TO PRIOR APPLICATIONS

This Application is a Continuation Application of PCT International Application No. PCT/KR2022/012755 (filed on Aug. 25, 2022), which claims priority to Korean Patent Application No. 10-2022-0048486 (filed on Apr. 19, 2022), which are all hereby incorporated by reference in their entirety.

BACKGROUND

The present disclosure relates to a polarization analysis apparatus that adjusts an angle of incidence or a numerical aperture by using an aperture, and a method.

At a time when the size of a semiconductor device decreases, improvement in a semiconductor wafer measurement system needs to be ensured. Ordinarily, in manufacturing of a semiconductor device such as a logic and memory device, semiconductor wafer processing comprises a number of semiconductor manufacturing processes, to form a semiconductor device of a variety of features and levels. A plurality of semiconductor devices is manufactured as one device on a single semiconductor wafer and then separated into individual semiconductor devices.

In a measurement process, one or more features of a wafer, such as measurements (e.g., a line width, a thickness, an angle and the like) of a feature formed on a wafer, are measured, and the quality of processing is determined based on measurement of one or more features.

A polarization analysis apparatus samples light reflected from a sample with different optical parameters. Polarization analysis data of a measurement target is used to determine properties of a sample.

As a related art, an oval polarization measurement device for measuring a semiconductor sample is disclosed in KR Patent No. 10-2134943. According to the document, an improved polarization measurement tool allowing of decoupling measurement data on different target properties easily is provided.

The oval polarization measurement device as a related art measures properties of a sample by using one aperture, does not adaptively react to measurement sensitivity where the oval polarization measurement device reacts differently depending on the sort or properties of a sample, and is not applicable to various fields efficiently.

To prevent this from happening, a single measurement apparatus needs to be usable for measurement in various application fields.

(Patent document 1) KR Patent No. 10-2134943

SUMMARY

Conventionally, a single aperture is used to measure properties of a sample, causing deterioration in application to various fields based on the sort or properties of a sample.

The objective of the present disclosure is to provide a polarization analysis apparatus using two apertures and a method.

Additionally, the objective of the present disclosure is to provide a polarization analysis apparatus adjusting an angle of incidence or a numerical aperture by using two apertures, and a method.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

A polarization analysis apparatus that adjusts an angle of incidence or a numerical aperture by using an aperture, in one embodiment, may comprise a first aperture that transmits a lighting beam reflected from a sample on a substrate, a second aperture that transmits a lighting beam having passed through the first aperture, and a detector that detects a lighting beam having passed through the second aperture and selects an angle of incidence of the lighting beam and numerical apertures of the first aperture and the second aperture.

A polarization analysis apparatus that adjusts an angle of incidence and a numerical aperture by using an aperture, in one embodiment, may comprise a light emitting device that outputs a lighting beam, a polarization device that directs a lighting beam output from the light emitting device to a sample on a substrate, an aperture that transmits a lighting beam reflected from the sample on the substrate, based on a rotary or linear operation, and a detector that detects a lighting beam having passed through the aperture, and selects an angle of incidence of the lighting beam output from the light emitting device, and a numerical aperture of the aperture.

A method in which a polarization analysis apparatus adjusts an angle of incidence or a numerical aperture by using an aperture, in one embodiment, may comprise a first step of transmitting a lighting beam reflected from a sample on a substrate by a first aperture, a second step of transmitting a lighting beam having passed through the first aperture by a second aperture, and a third step of detecting a lighting beam having passed through the second aperture, and selecting an angle of incidence of the lighting beam and numerical apertures of the first aperture and the second aperture by a detector.

According to the present disclosure, a polarization analysis apparatus may comprise a first aperture that transmits a lighting beam reflected from a sample on a substrate, and a second aperture that transmits a lighting beam having passed through the first aperture, to applicably select an angle of incidence and a numerical aperture of a lighting beam.

According to the present disclosure, the first aperture may operate in a rotary or linear manner, to adjust an angle of incidence and a numerical aperture of a lighting beam.

According to the present disclosure, the first aperture may be controlled to move in a first direction, and the second aperture may be controlled to move in a second direction that is perpendicular to the first direction, to applicably select an angle of incidence or a numerical aperture of a lighting beam.

Specific effects are described along with the above-described effects in the section of detailed description.

BRIEF DESCRIPTION OF THE DRAWINGS

FIG. 2 is an exemplary view showing a degree of the angle of incidence of a first aperture, in one embodiment.

FIG. 3 is an exemplary view showing a first aperture, in one embodiment.

FIG. 8 is an exemplary view showing the movement state of an aperture, in one embodiment.

FIG. 9 is an exemplary view showing the movement state of an aperture, in another embodiment.

DETAILED DESCRIPTION

Figure 1:
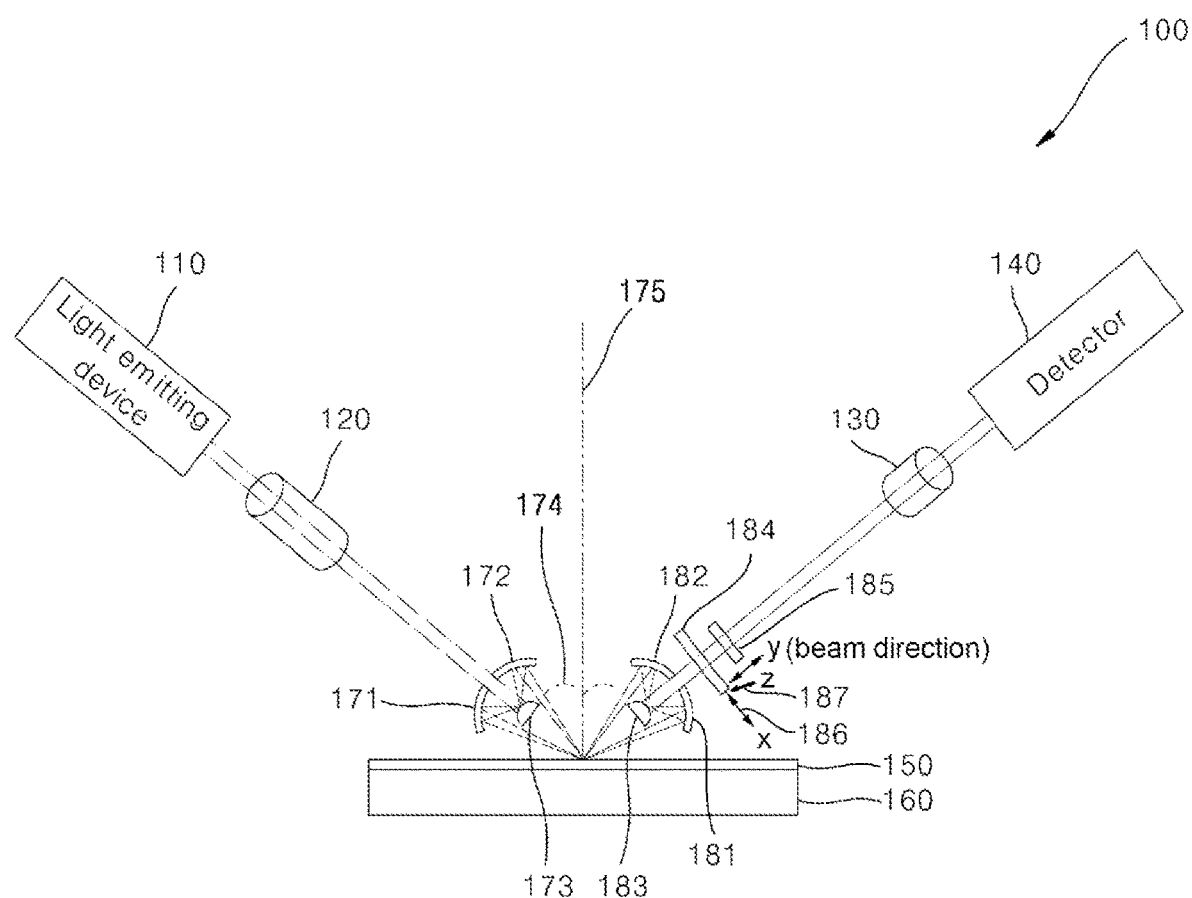
FIG. 1 is an exemplary view showing a polarization analysis apparatus for adjusting an angle of incidence or a numerical aperture, in one embodiment.

The above-described aspects, features and advantages are specifically described hereafter with reference to accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components are not to be limited by the terms. Certainly, a first component can be a second component, unless stated to the contrary.

When any one component is described as being "in the upper portion (or lower portion)" or "on (or under)" another component, any one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It is to be further understood that the terms "comprise" or "include" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, described is a polarization analysis apparatus for adjusting an angle of incidence (AOI) and/or a numerical aperture (NA) by using an aperture, in several embodiments.

FIG. 1 is an exemplary view showing a polarization analysis apparatus for adjusting an angle of incidence or a numerical aperture, in one embodiment.

Referring to FIG. 1, a polarization analysis apparatus 100 for adjusting an angle of incidence or a numerical aperture, in one embodiment, may comprise a light emitting device 110, a polarization device 120, a first aperture 184, a second aperture 185, an analyzer 130, and detector 140.

Additionally, the polarization analysis apparatus 100 for adjusting an angle of incidence or a numerical aperture, in one embodiment, may comprise a first mirror 173 that reflects a lighting beam output from the polarization device 120, and a first lens 171 and a second lens 172 that direct a lighting beam reflected through the first mirror 173 onto a sample 150 disposed on a substrate 160.

In one embodiment, the first mirror 173 may be formed to focus a lighting beam on a sample 150.

Further, the polarization analysis apparatus 100 for adjusting an angle of incidence or a numerical aperture, in one embodiment, may comprise a first lens 171 and a second lens 172 that direct light reflected from a sample 150 toward a second mirror 183, and a second mirror 183 that reflects a lighting beam directed by the first lens 171 and the second lens 172.

The configuration of the polarization analysis apparatus 100 for adjusting an angle of incidence or a numerical aperture is illustrated in FIG. 1, as an embodiment, and components of the polarization analysis apparatus 100 are not limited to those of the embodiment in FIG. 1. When necessary, some of the components may be added, changed or removed.

In one embodiment, the light emitting device 110 may comprise a light source for generating a lighting beam. For example, an angle of incidence 174 of a light source toward a sample 150 may be adjusted.

In one embodiment, the polarization device 120 may set the positions and sizes of an aperture and a field stop, and adjust a lighting beam of the polarization device 120.

Ordinarily, the polarization device 120 may perform an arbitrary proper beam shaping function, e.g., the manipulating, collimating, converging, expanding, decreasing and the like of a beam profiler.

Additionally, the polarization device 120 may be formed to rotate for rotating polarizer ellipsometry (RPE), or formed to be fixed for another type of ellipsometry.

In one embodiment, a lighting beam output from the polarization device 120 is reflected from the first mirror 173, and then delivered to the first lens 171 and the second lens 172. The lighting beam is incident to a sample 150 through the first lens 171 and the second lens 172.

In one embodiment, the first lens 171 and the second lens 172 may be formed to focus a lighting beam on a sample 150.

For example, a lighting beam passing through the second lens 172 may be incident to a sample 150 at an angle of incidence 174.

Additionally, the angle of incidence 174, at which a lighting beam is incident to the sample 150, may be adjusted by adjusting an output angle of a lighting beam that is output from the light source of the light emitting device 110.

In one embodiment, the lighting beam reflected through the sample 150 is delivered to the second mirror 183 through a third lens 181 and a fourth lens 182. The lighting beam may be reflected from the second mirror 183 and pass through (e.g., selectively pass through) the first aperture 184.

In one embodiment, the second mirror 183 may be formed to focus a lighting beam.

In one embodiment, the third lens 181 and the fourth lens 182 may be formed to focus a lighting beam on the second mirror 182.

In one embodiment, the first lens 171 and the third lens 181 may be disposed in a position where the first lens 171 and the third lens 181 are symmetrical to each other with respect to a tangent line 175, and the second lens 172 and the fourth lens 182 may be disposed in a position where the second lens 172 and the fourth lens 182 are symmetrical to each other with respect to the tangent line 175.

For example, the concave portion of each of the first lens 171, the second lens 172, the third lens 181 and the fourth lens 182 may be disposed toward a point at which a lighting beam is irradiated to a sample 150.

In one embodiment, the first aperture 184 may transmit the lighting beam reflected from the sample 150 that is disposed on the upper surface of the substrate 160. The first aperture 184 may transmit at least part of the lighting beam reflected from the sample 150 and reflected from the second mirror 183 through the third lens 181 and the fourth lens 182.

In one embodiment, the first aperture 184 may operate in a rotary or linear manner, to adjust the angle of incidence and the numerical aperture of the lighting beam reflected from the sample 150.

For example, a plurality of rotating plates (e.g., five rotating plates) may be disposed side by side at the first aperture 184. Each of the plurality rotating plates may be formed to rotate.

Further, each of the plurality of rotating plates has a hole that transmits the lighting beam reflected from the sample 150.

In one embodiment, the first aperture 184 may move linearly in a direction where the plurality of rotating plates is disposed side by side. For example, in the case where the plurality of rotating plates is disposed in a horizontal direction, the first aperture 184 may move horizontally.

In one embodiment, the first aperture 184 may move in a first direction 186 that is perpendicular to the direction of the lighting beam.

In one embodiment, the second aperture 185 may be spaced a predetermined distance apart from the first aperture 184. For example, the second aperture 185 may be disposed at the rear of the first aperture 184, in a position where the second aperture transmits the lighting beam passing through the first aperture 184 selectively.

In one embodiment, the second aperture 185 may move in a direction that is perpendicular to the direction in which the first aperture 184 moves. For example, the second aperture 185 may move in a direction 187 that is perpendicular to the direction where the lighting beam moves.

In one embodiment, the second aperture 185 moves linearly (e.g., a second direction 187), and adjust the angle of incidence and numerical aperture of the lighting beam having passed through the first aperture 184. For example, the angle of incidence and the numerical aperture of the lighting beam passing through the first aperture 184 may differ from the angle of incidence and the numerical aperture of the lighting beam passing through the second aperture 185.

In one embodiment, the second aperture 185 may have a plurality of slits. For example, the plurality of slits may be formed in the same direction. For example, each of the plurality of slits may have a different size (e.g., the thickness of a slit).

According to the present disclosure, the first aperture 184 and the second aperture 185 may move to adjust an angle of incidence and a numerical aperture, such that the angle of incidence and the numerical aperture may correspond to a different measurement sensitivity depending on the thickness and material of a sample 150.

Additionally, the lighting beam having passed through the second aperture 185 is delivered to the detector 140 through the analyzer 130.

In one embodiment, the analyzer 130 may analyze and/or control the movement of at least one of the first aperture 184 and the second aperture 185.

In one embodiment, the analyzer 130 is rotated by different components or fixed to different components, to collect different polarization states.

Further, according to the present disclosure, a single polarization analysis apparatus may measure the thicknesses and physical properties of various samples.

Further, according to the present disclosure, the aperture (e.g., the first aperture 184 and the second aperture 185) moving the lighting beam reflected from a sample in a rotary or linear manner is used to apply different angles of incidence and numerical apertures, such that the thicknesses of a variety samples in a range from a few Åm to a few μm may be measured depending on the thickness or materials of samples.

According to the present disclosure, the numerical apertures of a reflective wave reflected from the sample 150 may be determined through the aperture of different sizes, and the angle of incidence of the reflective wave may be determined by adjusting the position of the aperture.

In one embodiment, the detector 140 may detect (or determine) the distribution of the property and thickness of a sample 150, through a lighting beam that is detected based on the movement of at least one of the first aperture 184 and the second aperture 185.

To this end, the first aperture 184 and the second aperture 185 may be disposed in a direction perpendicular to the direction in which the lighting beam reflected from a sample 150 directs the analyzer 130.

In one embodiment, the detector 140 may collect a lighting beam that is analyzed through the analyzer 130. The detector 140 may be a spectrometer that ensures sufficiently high quantum efficiency in a wide range of wavelengths.

The detector 140 may comprise one or more of reflection mirrors for reflecting an output beam through a prism.

For example, the detector 140 may comprise at least one of a charged coupled device (CCD) detector having sufficiently high quantum efficiency in a range of about 190 nm to about 900 nm wavelengths, a photo diode array having sufficiently high quantum efficiency in a range of about 700 nm to about 2000 nm wavelengths, and a photo diode array having sufficiently high quantum efficiency in a range of about 150 nm to about 400 nm wavelengths. A proper detector may comprise at least one of a charged coupled device (CCD), a CCD array, a time delay integration (TDI) sensor, a TDI sensor array, a photomultiplier tube (PMT), and another sensor.

As described above, the polarization analysis apparatus 100 according to the present disclosure may select an angle of incidence AOI and a numerical aperture NA. For example, the first aperture 184 and the second aperture 185 may be disposed behind the third lens 181 and the fourth lens 182 that collect light. Additionally, an angle of incidence may be selected based on the position of the hole of the first aperture 184, and the numerical aperture may be selected based on the size of the slit of the second aperture 185.

FIG. 2 is an exemplary view showing a degree of the angle of incidence of a first aperture, in one embodiment.

Referring to FIG. 2, in terms of the first aperture 184 of one embodiment, the angle of incidence is about 0-45 degrees, and an error range is ±2.5 degrees, in a first section 201, the angle of incidence is about 45-50 degrees, and an error range is ±2.5 degrees, in a second section 202, the angle of incidence is about 50-55 degrees, and an error range is ±2.5 degrees, in a third section 203, the angle of incidence is about 55-60 degrees, and an error range is ±2.5 degrees, in a fourth section 204, and the angle of incidence is about 60-65 degrees, and an error range is ±2.5 degrees, in a fifth section 205.

A minimum value of the angle of incidence may be 42.5 degrees, while a maximum value may be 67.5 degrees.

As described above, a discontinuous range of the angle of incidence separates spatially by a minimum of 0.1°. Each of the angles of incidence may be in a range of ±2.5 degrees, and the entire angles of incidence may be in a range of 42.5-67.5 degrees.

FIG. 3 is an exemplary view showing a first aperture, in one embodiment.

Referring to FIG. 3, a first aperture 184 of one embodiment may comprise a plurality of rotating plates (e.g., five rotating plates) 320, 330, 340, 350, 360.

In one embodiment, each of the plurality of rotating plates (e.g., the five rotating plates) 320, 330, 340, 350, 360, included in the first aperture 184, may have one hole. The position of each hole may vary depending on a rotating plate.

For example, for a first rotating plate 320, a first hole 321 may be formed in a 12 o'clock position, for a second rotating plate 330, a second hole 331 may be formed in a 10 o'clock position, for a third rotating plate 340, a third hole 341 may be formed in a 9 o'clock position, for a fourth rotating plate 350, a fourth hole 351 may be formed in an 8 o'clock position, and for a fifth rotating plate 360, a fifth hole 361 may be formed in a 6 o'clock position.

For example, the holes formed at each of the plurality of rotating plates (e.g., the five rotating plates) 320, 330, 340, 350, 360 may be spaced at regular intervals.

In one embodiment, the first aperture 184 may move in a first direction (e.g., an x-axis direction or a −x-axis direction). The first aperture 184 may move in the first direction (e.g., the x-axis direction or the −x-axis direction), to allow a lighting beam reflected from the second mirror 183 to pass. The lighting beam reflected from the second mirror 183 may pass through any one of the plurality of rotating plates (e.g., the five rotating plates) 320, 330, 340, 350, 360.

Additionally, in one embodiment, the first aperture 184 may comprise one rotating plate. At this time, the rotating plate may rotate to transmit the lighting beam selectively through the hole that is formed at the rotating plate.

As describe above, the first aperture 184 having a slit (e.g., hole) the position of which is designated, in the present disclosure, moves linearly in a horizontal direction, to select a required angle of incidence. In the case where the first aperture 184 moves in the horizontal direction, the position of the vertical axis of the slit (e.g., the hole) changes, and the position of the vertical axis of each of the slits (e.g., the holes) may have a unique angle of incidence.

Figure 4:
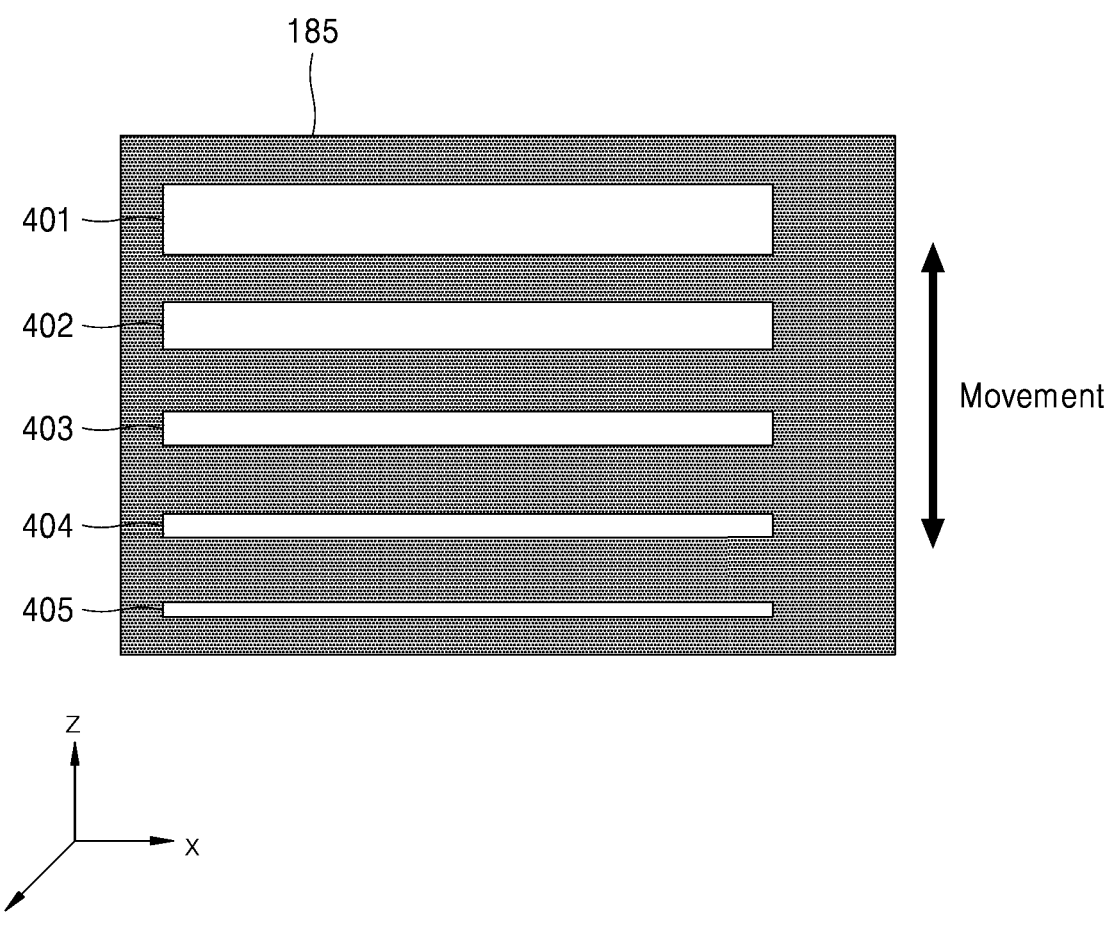
FIG. 4 is an exemplary view showing a second aperture, in one embodiment.

FIG. 4 is an exemplary view showing a second aperture, in one embodiment.

Referring to FIG. 4, a second aperture 185 of one embodiment may have a plurality of slits (e.g., five slits) 401, 402, 403, 404, 405. The position of each of the plurality of slits 401, 402, 403, 404, 405 may differ. Additionally, the size (e.g., the thickness) of each of the slits 401, 402, 403, 404, 405 may differ.

For example, a first slit 401 may have the greatest thickness and be disposed in an uppermost position, a second slit 402 may have a thickness less than the thickness of the first slit 401 and be disposed at the lower end of the first slit 401, and a third slit 403 may have a thickness less than the thickness of the second slit 402 and be disposed at the lower end of the second slit 402. Further, a fourth slit 404 may have a thickness less than the thickness of the third slit 403 and be disposed at the lower end of the third slit 403, and a fifth slit 405 may have a thickness less than the thickness of the fourth slit 402 and be disposed at the lower end of the fourth slit 404.

As illustrated in FIG. 4, each of the plurality of slits is shaped into a rectangle. However, the slit may have a different shape instead of a rectangle shape.

Additionally, as illustrated in FIG. 4, the thickest first slit 401 is disposed in an uppermost position, for example, but a thick slit may be disposed at a lower end.

In one embodiment, the second aperture 185 may move in a second direction (e.g., a z-axis direction or a −z-axis direction). The second aperture 185 may move in the second direction (e.g., the z-axis direction or the −z-axis direction), to allow a lighting beam reflected from the second mirror 183 to pass. The lighting beam reflected from the second mirror 183 may pass through any one of the plurality of slits (e.g., the five slits) 401, 402, 403, 404, 405.

As described above, the numerical aperture of the second aperture 185 may change depending on the size of the slit, and like the first aperture 184, the second aperture 185 having a slit the position of which is designated moves linearly in a perpendicular direction, to select a numerical aperture.

Figure 5:
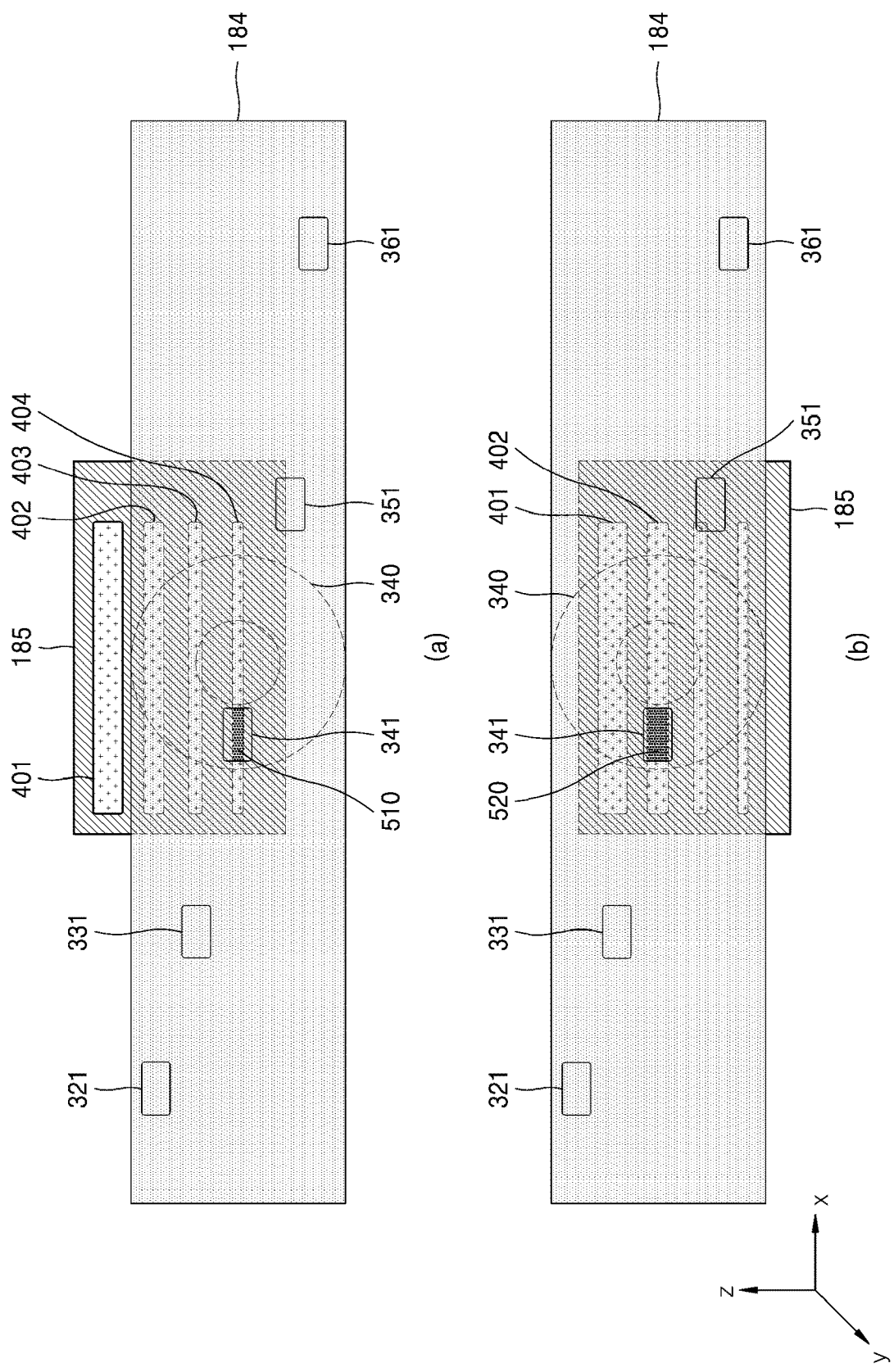
FIG. 5 is an exemplary view showing the movement state of an aperture, in one embodiment.

FIG. 5 is an exemplary view showing the movement state of an aperture, in one embodiment.

FIG. 5, (a) is an exemplary view showing that the second aperture 185 is not yet moved, and FIG. 5, (b) is an exemplary view showing that the second aperture 185 is moved.

Referring to FIG. 5, (a) and (b), in the state where the first aperture 184 is not moved, the second aperture 185 may be moved in the second direction (e.g., the −z-axis direction).

In one embodiment, the first aperture 184 may have a plurality of holes (e.g., five holes) 321, 331, 341, 351, 361. The x-axis value and z-axis value of the position of each of the holes may differ.

For example, a first hole 321 may be disposed in an uppermost position, and a second hole 331 may be disposed to the right side from the first hole 321 by a predetermined distance, while being disposed further downward than the first hole 321. A third hole 341 may be disposed to the right side from the second hole 331 by a predetermined distance, while being disposed further downward than the second hole 331, and a fourth hole 351 may be disposed to the right side from the third hole 331 by a predetermined distance, while being disposed further downward than the third hole 341. Further, a fifth hole 361 may be disposed to the right side from the fourth hole 351 by a predetermined distance, while being disposed further downward than the fourth hole 351.

For example, the plurality of holes (e.g., the five holes) 321, 331, 341, 351, 361 may have the same size.

In one embodiment, the first aperture 184 may move or may not move in the first direction (e.g., the x-axis direction or the −x-axis direction). The first aperture 184 may move or may not move in the first direction (e.g., the x-axis direction or the −x-axis direction), to allow a lighting beam reflected from the second mirror 183 to pass. The lighting beam reflected from the second mirror 183 may pass through any one of the plurality of holes (e.g., the five holes) 321, 331, 341, 351, 361.

In one embodiment, the second aperture 185 may be disposed at the rear end of the first aperture 184, and move in the second direction (e.g., the z-axis direction or the −z-axis direction).

In one embodiment, in the case where the second aperture 185 is at a first position (i.e., (a) of FIG. 5) in the state where the first aperture 184 is not moved, a lighting beam may pass through an area 510 where the hole 341 of the first aperture 184 and the slit 404 (e.g., the fourth slit) of the second aperture 185 cross each other.

Then in the case where the second aperture 185 moves to a second position (i.e., (b) of FIG. 5) from the first position (i.e., (a) of FIG. 5) in the state where the first aperture 184 is not moved, a lighting beam may pass through an area 520 where the hole 341 of the first aperture 182 and the slit 402 (e.g., the second slit) of the second aperture 185 cross each other.

As the second aperture 185 moves to the second position (i.e., (b) of FIG. 5) from the first position (i.e., (a) of FIG. 5) in the state where the first aperture 184 is not moved, the angle of a lighting beam passing through the area 520 where the hole 341 of the first aperture 184 and the slit 402 (e.g., the second slit) of the second aperture 185 cross each other may be calculated, to measure the thickness and material of a sample 150.

According to the present disclosure, data containing different numerical apertures may be detected at the same angle of incidence, as described above. For example, as the second aperture 185 moves perpendicularly, in the state where the first aperture 184 is fixed at a specific angle of incidence (i.e., in the state where a lighting beam passes through a certain hole), polarization analysis data containing different numerical apertures may be detected.

Figure 6:
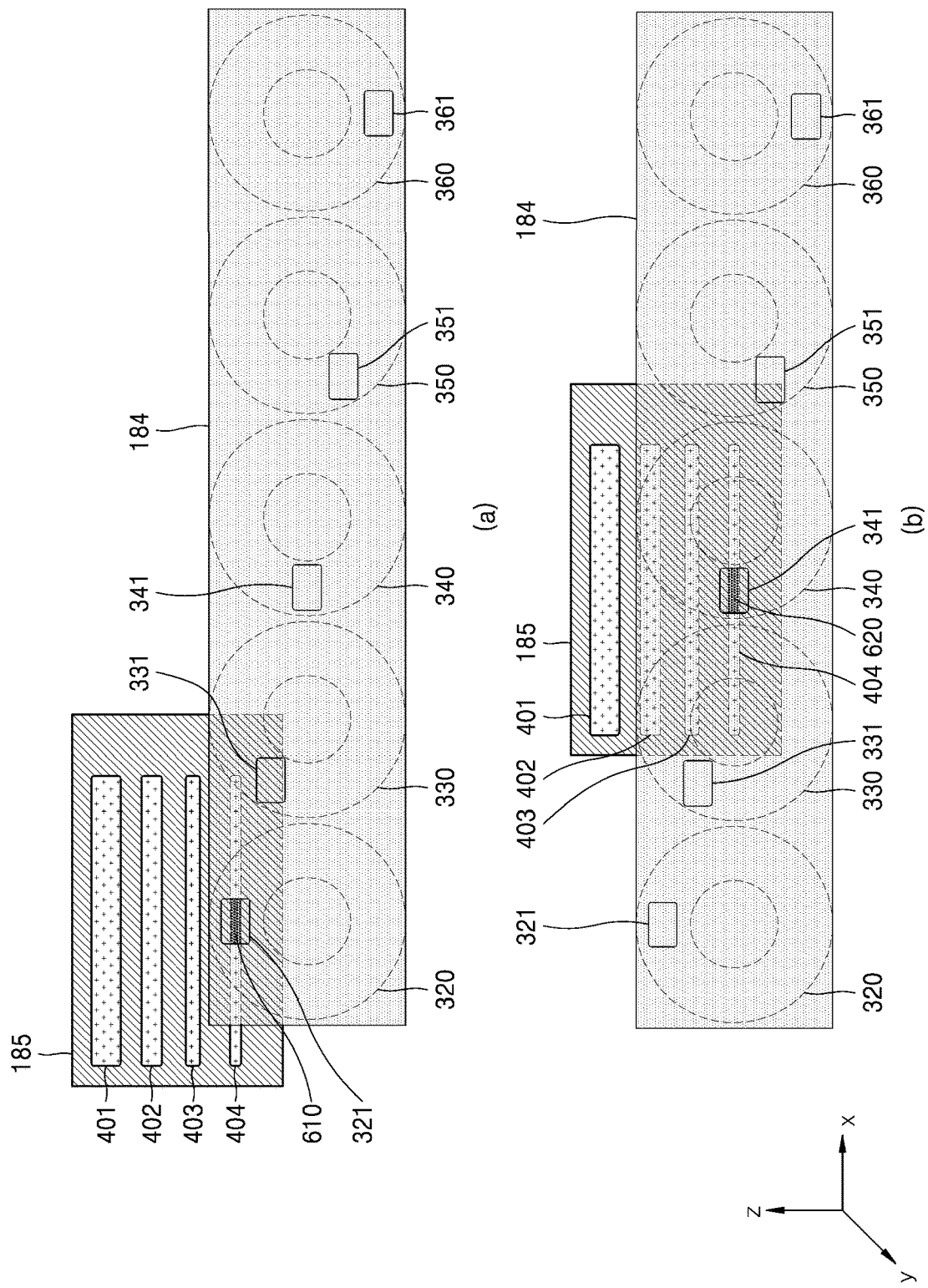
FIG. 6 is an exemplary view showing the movement state of an aperture, in another embodiment.

FIG. 6 is an exemplary view showing the movement state of an aperture, in one embodiment.

FIG. 6, (a) is an exemplary view showing the first aperture 184 is not yet moved, and FIG. 6, (b) is an exemplary view showing the first aperture 184 is moved to the left side.

Referring to FIG. 6, (a) and (b), the first aperture 184 may move in the first direction (e.g., the −x-axis direction) in the state where the second aperture 185 is not moved.

In one embodiment, the first aperture 184 may have a plurality of holes (e.g., five holes) 321, 331, 341, 351, 361. The x-axis value and z-axis value of the position of each of the holes may differ.

In one embodiment, the first aperture 184 may move in the first direction (e.g., the −x-axis direction). The first aperture 184 may move in the first direction (e.g., the −x-axis direction) to allow a lighting beam reflected from the second mirror 183 to pass. The lighting beam reflected from the second mirror 183 may pass through any one of the plurality of holes (e.g., the five holes) 321, 331, 341, 351, 361.

In one embodiment, in the case where the first aperture 184 is at a first position (i.e., (a) of FIG. 6) in the state where the second aperture 185 is not moved, a lighting beam may pass through an area 610 where the hole 321 of the first aperture 184 and the slit 404 (e.g., the fourth slit) of the second aperture 185 cross each other.

Then in the case where the first aperture 184 moves to a second position (i.e., (b) of FIG. 6) from the first position (i.e., (a) of FIG. 6) (i.e., in the case where the first aperture 184 moves in the −x-axis direction), in the state where the second aperture 185 is not moved, a lighting beam may pass through an area 620 where the hole 341 of the first aperture 184 and the slit 402 (e.g., the second slit) of the second aperture 185 cross each other.

As the first aperture 184 moves to the second position (i.e., (b) of FIG. 6) from the first position (i.e., (a) of FIG. 6), in the state where the second aperture 185 is not moved, the angle of a lighting beam passing through the area 620 where the hole 341 of the first aperture 184 and the slit 404 (e.g., the fourth slit) of the second aperture 185 cross each other may be calculated, to measure the thickness and material of a sample 150.

According to the present disclosure, data containing different angles of incidence may be detected based on the same numerical aperture. For example, in the state where the second aperture 185 is fixed to a certain numerical aperture (i.e., in the state where a lighting beam passes through a certain slit), the first aperture 184 moves horizontally (e.g., in the −x-axis direction), to detect polarization analysis data containing different angles of incidence.

Figure 7:
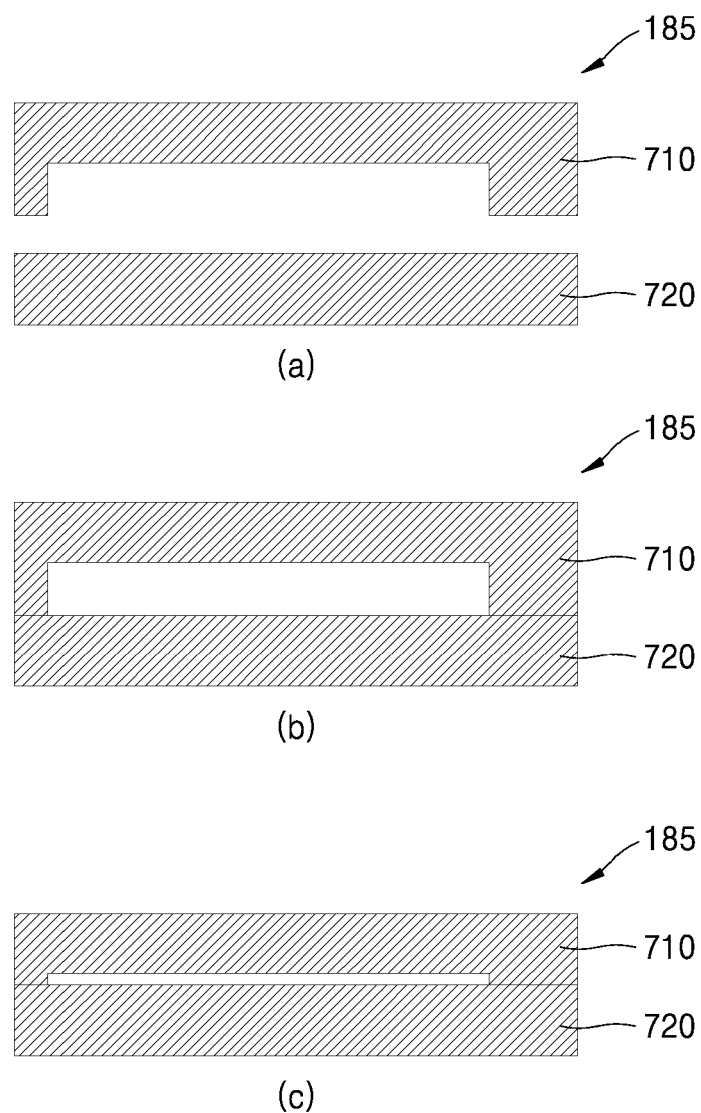
FIG. 7 is an exemplary view showing a second aperture, in another embodiment.

FIG. 7 is an exemplary view showing a second aperture, in another embodiment.

FIG. 7, (a) is an exemplary view showing a first state in which a first sub aperture of the second aperture is not yet moved in the direction of a second sub aperture, in another embodiment. FIG. 7, (b) is an exemplary view showing a second state in which the first sub aperture of the second aperture moves in the direction of the second sub aperture, in another embodiment. FIG. 7, (c) is an exemplary view showing a third state in which the first sub aperture of the second aperture moves in the direction of the second sub aperture, in another embodiment.

Referring to FIG. 7, (a) to (c), a second aperture 185 in another embodiment may comprise a first sub aperture 710 having a "H" shape and a second sub aperture 720 having a "−" shape.

In one embodiment, the first sub aperture 710 having a "H" shape and the second sub aperture 720 having a "−" shape may adjust the size of a slit, based on a movement. For example, any one (e.g., the first sub aperture 710) of the first sub aperture 710 and the second sub aperture 720 may be disposed in front of or behind the other sub aperture (e.g., the second sub aperture 720), and move in the second direction (e.g., a −z direction), and base on the movement, the size of a slit may be adjusted. According to the present disclosure, a driving part (not illustrated) may be further included and deliver power to move at least one of the first sub aperture 710 and the second sub aperture 720.

As the driving part (not illustrated) moves at least one of the first sub aperture 710 and the second sub aperture 720, the second aperture 185 may form slots 730, 740 having different sizes.

Additionally, FIG. 7 shows the first sub aperture 710 moves in one direction (e.g., the −z direction), but the movement direction of the first aperture 710 is not limited. According to the present disclosure, the second sub aperture 720 may move in another direction (e.g., a z direction or the −z direction).

For example, in the case where the first sub aperture 710 is moved by the driving part (not illustrated) in one direction (e.g., the −z direction), the size of the slot may decrease gradually (e.g, 730→740).

FIG. 8 is an exemplary view showing the movement state of an aperture, in one embodiment.

FIG. 8, (a) is an exemplary view showing that the second sub aperture 720 of the second aperture 185 is not yet moved in one direction (e.g., the −z direction), and FIG. 8, (b) is an exemplary view showing the second sub aperture 720 of the second aperture 185 is moved in one direction (e.g., the −z direction).

Referring to FIGS. 8, (a) and 8(b), the second sub aperture 720 of the second aperture 185 may move in one direction (e.g., the −z-axis direction) in the state where the first aperture 184 is not moved. Alternatively, the first sub aperture 710 of the second aperture 185 may move in one direction (e.g., the z direction), in the state where the first aperture 184 is not moved.

As described above, the first sub aperture 710 of the second aperture 185 may move or may not move in one direction (e.g., the z-axis direction or the −z-axis direction). Likewise, the second sub aperture 720 of the second aperture 185 may move or may not move in one direction (e.g., the z-axis direction or the −z-axis direction).

Accordingly, a lighting beam reflected from the second mirror 183 may be transmitted, based on the movement of the sub aperture of at least one of the first aperture 814 and the second aperture 185.

In one embodiment, the first sub aperture 710 may be disposed at the rear end of the second sub aperture 720 and move in one direction (e.g., the z-axis direction or the −z-axis direction).

Alternatively, the first sub aperture 710 may be disposed at the front end of the second sub aperture 720 and move in one direction (e.g., the z-axis direction or the −z-axis direction).

As at least one of the first sub aperture 710 and the second sub aperture 720 of the second aperture 185 moves in the state where the first aperture 184 is not moved, the angle of a lighting beam passing through an area where the hole 341 of the first aperture 184 and a slit between the first sub aperture 710 and the second sub aperture 720 across each other may be calculated, to measure the thickness and material of a sample 150.

According to the present disclosure, data containing different numerical apertures at the same angle of incidence may be detected. For example, the sub aperture of the second aperture 185 moves perpendicularly in the state where the first aperture 184 is fixed at a certain angle of incidence (i.e., in the state where a lighting beam passes through a certain hole), to detect polarization analysis data containing different numerical apertures.

FIG. 9 is an exemplary view showing the movement state of an aperture, in another embodiment.

FIG. 9, (a) is an exemplary view showing the first aperture 184 is not yet moved, and FIG. 9, (b) is an exemplary view showing the first aperture 184 is moved to the left (e.g., −x-axis).

Referring to FIG. 9, (a) and (b), the first aperture 184 may move in one direction (e.g., the −x-axis direction), in the state where the second aperture 185 (e.g., the first sub aperture 710 and the second sub aperture 720) is not moved.

In one embodiment, the first aperture 184 may have a plurality of holes (e.g., five holes) 321, 331, 341, 351, 361. Additionally, the x-axis value and z-axis value of the position of each hole may differ.

In one embodiment, the first aperture 184 may move in one direction (e.g., the −x-axis direction). The first aperture 184 may move in one direction (e.g., the −x-axis direction), to allow a lighting beam reflected from the second mirror 183 to pass. The lighting beam reflected from the second mirror 183 may pass through any one of the plurality of holes (e.g., the five holes) 321, 331, 341, 351, 361.

In one embodiment, in the case where the first aperture 184 is in a first position (i.e., FIG. 9, (a)) in the state were the second aperture 185 (e.g., the first sub aperture 710 and the second sub aperture 720) is not moved, a lighting beam may pass through an area 610 where the hole 321 of the first aperture 184 and the slit of the second aperture 185 cross each other.

Then in the case where the first aperture 184 moves to a second position (i.e., FIG. 9, (b)) from the first position (i.e., FIG. 9, (a)) (i.e., in the case where the first aperture 184 moves in the −x-axis direction), in the state where the second aperture 185 is not moved, a lighting beam may pass through an area where the hole 341 of the first aperture 184 and the slit of the second aperture 185 cross each other.

Since the first aperture 184 moves to the second position (i.e., FIG. 9, (b)) from the first position (i.e., FIG. 9, (a)) in the state where the second aperture 185 is not moved, the angle of a light beam passing through the area 620 where the hole 341 of the first aperture 184 and the slit of the second aperture 185 cross each other may be calculated, to measure the thickness and material of a sample 150.

The size of each of the first hole 321 to the fifth hole 361 of the first aperture 184 in yet another embodiment may be adjusted like the first sub aperture 710 and the second sub aperture 720 of the second aperture 185 in another embodiment.

According to the present disclosure, data containing different angles of incidence may be detected based on the same numerical aperture, as described above. For example, the first aperture 184 moves horizontally (e.g., in the −x-axis direction), in the state where the second aperture 185 is fixed to a certain numerical aperture (i.e., a lighting beam passes through a certain slit), polarization analysis data containing different angles of incidence may be detected.

Each of the above-described steps in the flowcharts may be performed regardless of the order illustrated, or performed at the same time. Further, in the present disclosure, at least one of the components, and at least one operation performed by at least one of the components can be embodied as hardware and/or software.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiments.

The invention claimed is:

1. A polarization analysis apparatus that adjusts an angle of incidence or a numerical aperture by using an aperture, comprising:
    a first aperture that operates in a first direction perpendicular to a beam direction in which a lighting beam proceeds and transmits the lighting beam reflected from a sample on a substrate, wherein the first aperture comprises a plurality of circular plates, and each of the circular plates has a hole that is formed in a direction parallel with the first direction, transmits the lighting beam and controls an angle of incidence of the lighting beam;
    a second aperture that operates in a second direction perpendicular to the first direction and the beam direction and that transmits the lighting beam having passed through a circulate plate-shaped hole which is included in the first aperture, wherein the second aperture comprises a plurality of slits having different sizes, and the slits are arranged in a line along a direction parallel with the second direction and adjust a numerical aperture of the lighting beam; and a detector that detects the lighting beam having passed through the second aperture.

2. The polarization analysis apparatus of claim 1, wherein the plurality of circular plates of the first aperture comprises five rotating plates, and each of the five rotating plates has a hole that transmits the lighting beam reflected from the sample and that is spaced from each other to control the angel of incidence in a discontinuous range.

3. The polarization analysis apparatus of claim 2, wherein the first direction in which the first aperture operates is a direction in which the five rotating plates are disposed.

4. The polarization analysis apparatus of claim 2, wherein each of the five rotating plates of the first aperture rotates to transmit the lighting beam through the hole that is formed on each of the five rotating plates, and the hole formed on each of the five rotating plates is formed in a different position, in a counterclockwise direction, based on an order in which the five rotating plates are disposed.

5. The polarization analysis apparatus of claim 1, further comprising an analyzer that directs the lighting beam having passed through the second aperture to the detector.

6. The polarization analysis apparatus of claim 1, wherein the detector detects properties and a thickness distribution of the sample through the lighting beam detected based on a movement of at least one of the first aperture and the second aperture.

7. The polarization analysis apparatus of claim 1, wherein the first aperture and the second aperture are disposed in a direction that is perpendicular to a direction along which the lighting beam reflected from the sample is directed to an analyzer.

8. The polarization analysis apparatus of claim 1, further comprising:

a light emitting device that outputs the lighting beam; and a polarization device directing the lighting beam output from the light emitting device to the sample on the substrate.

9. The polarization analysis apparatus of claim 8, wherein the light emitting device adjusts an angle at which the lighting beam emits, based on the angle of incidence detected by the detector.

10. The polarization analysis apparatus of claim 1, wherein the second aperture comprises a first sub aperture and a second sub aperture that are provided to adjust a size of a slit, based on a movement.

11. The polarization analysis apparatus of claim 10, wherein any one of the first sub aperture and the second sub aperture is disposed in front of or behind the other sub aperture, and the size of the slit is adjusted based on a movement in the second direction.

12. A method in which a polarization analysis apparatus adjusts an angle of incidence or a numerical aperture by using an aperture, comprising:

a first step of operating in a first direction perpendicular to a beam direction in which a lighting beam proceeds and transmitting the lighting beam reflected from a sample on a substrate, by a first aperture;

a second step of operating in a second direction perpendicular the first direction and the beam direction and transmitting the lighting beam having passed through a circular plate-shaped hole which is included in the first aperture, by a second aperture; and a third step of detecting the lighting beam having passed through the second aperture, by a detector, wherein the first aperture comprises a plurality of circular plates, and each of the circular plates has a hole that is formed in a direction parallel with the first direction, transmits the lighting beam and controls an angle of incidence of the lighting beam, and the second aperture comprises a plurality of slits having different sizes, and the slits are arranged in a line along a direction parallel with the second direction and adjust a numerical aperture of the lighting beam.

13. The method of claim 12, wherein the third step comprises detecting properties and a thickness distribution of the sample, based on the lighting beam detected based on a movement of at least one of the first aperture and the second aperture.

* * * * *